United States Patent [19]

Dansui et al.

[11] Patent Number: 5,413,527
[45] Date of Patent: May 9, 1995

[54] ENVIRONMENTAL CONTROL APPARATUS

[75] Inventors: Yoshitaka Dansui, Osaka; Hiroko Sakai, Tokyo, both of Japan

[73] Assignee: Matsushita Electric Industrial Co., Ltd., Osaka, Japan

[21] Appl. No.: 113,691

[22] Filed: Aug. 31, 1993

[30] Foreign Application Priority Data

Aug. 31, 1992 [JP] Japan .................................. 4-230889

[51] Int. Cl.$^6$ ............................................. F24F 3/16
[52] U.S. Cl. .......................................... 454/57; 454/187
[58] Field of Search ........................... 454/56, 57, 187

[56] References Cited

U.S. PATENT DOCUMENTS

| | | | |
|---|---|---|---|
| 4,927,438 | 5/1990 | Mears et al. | 454/56 X |
| 4,963,069 | 10/1990 | Wurst et al. | 454/187 X |
| 5,069,113 | 12/1991 | Mattson et al. | 454/252 |
| 5,178,639 | 1/1993 | Hishi | 29/25.02 |
| 5,181,819 | 1/1993 | Sakata et al. | 454/187 X |
| 5,195,922 | 3/1993 | Genco | 454/57 |

OTHER PUBLICATIONS

"SMIF: A Technology for Wafer Cassette Transfer in VLSI Manufacturing", *Solid State Technology*, Jul. 1984, pp. 110–115.

Clean Room Handbook, Japan Air Cleaning Association, pp. 93–97.

*Primary Examiner*—Harold Joyce
*Attorney, Agent, or Firm*—Willian Brinks Hofer Gilson & Lione

[57] ABSTRACT

A substrate holder containing semiconductor substrates is held in an air-tight container for conveyance which is placed over the entrance of a chamber. The gas drawn by a first fan for circulating gas through the bottom wall of the chamber flows through a first duct for circulating gas so as to be cleaned by a first high-efficiency filter and to be supplied into the chamber again in a horizontal laminar flow. The clean gas is supplied into the chamber in a vertical laminar flow from a second duct for circulating gas which has a second fan for circulating gas and a second high-efficiency filter.

6 Claims, 15 Drawing Sheets

ENVIRONMENTAL CONTROL APPARATUS

BACKGROUND OF THE INVENTION

The present invention relates to an environmental control apparatus and, more particularly, it relates to an environmental control apparatus to be mounted in a device fabrication apparatus which requires a clean environment in producing such plate-like devices as semiconductor and liquid-crystal devices.

Since the fabrication processes for semiconductor, liquid-crystal, or like devices require a clean environment, it is necessary that an apparatus for producing these devices is placed in a clean environment. Hence, the device fabrication apparatus mentioned above is typically installed in such a clean room as shown in FIG. 15.

A variety of clean rooms are shown in pp.93–97 of "Clean Room Handbook" published by Japan Air Cleaning Association. Among them, the clean room shown in FIG. 15 is cited from FIG. 2.2.13 in p.96 of the same book. In FIG. 15, the device fabrication apparatus 51 is disposed in a clean area 52, for it requires a clean environment in producing plate-like devices.

The air blown into a ceiling area 54 by a blowing fan 53 is cleaned by a high-efficiency filter 55, so as to be supplied to the clean area 52. The air exhausted from the clean area 52 to an underfloor area 5B flows through a first duct 57, while a conditioned air introduced from outside flows through a second duct 58, both of which are blown into the ceiling area 54 by the blowing fan 53.

However, the provision of such a clean room in the aforesaid device fabrication system is disadvantageous in that the resulting system becomes larger in scale and hence requires a heavy investment. Moreover, a huge amount of maintenance cost is necessary in order to clean the entire clean room and to maintain a specified degree of cleanliness therein.

In view of the foregoing, there has recently been proposed an environmental control apparatus to be mounted in a device fabrication apparatus which requires a clean environment in producing devices, though the drawings thereof are omitted here.

The environmental control apparatus comprises an air-tight chamber containing a clean air, an entrance formed in the chamber through which devices are carried into the chamber, an exit formed in the chamber through which the devices are carried out of the chamber toward the device fabrication apparatus, and a means for conveying the devices in the chamber from the entrance to the exit.

As smaller device features are defined in such devices as semiconductor and liquid-crystal devices, a higher degree of cleanliness has been required in the environment in which the device fabrication apparatus for producing these devices is placed.

However, the conventional environmental control apparatus mentioned above is disadvantageous in that it requires a clean-air supplying device to supply a clean air into the chamber and that small impurities generated in the chamber are not removed.

SUMMARY OF THE INVENTION

In view of the foregoing, an object of the present invention is to provide an environmental control apparatus which does not require a clean-air supplying means for supplying a clean air into the air-tight chamber in order to clean the air in the air-tight chamber and which can remove extremely small impurities which are generated in the air-tight chamber.

To attain the above object, the present invention proposes the provision of a means for circulating gas which has a fan for circulating the gas in the air-tight chamber and a high-efficiency filter for cleaning the circulating gas so as to supply the clean gas in a laminar flow parallel to the surface of the devices.

A first environmental control apparatus according to the present invention aims at an environmental control apparatus to be mounted in a device fabrication apparatus which requires a clean environment in producing plate-like devices, comprising: an air-tight chamber; an entrance provided in said air-tight chamber through which devices are carried in said air-tight chamber, said devices being in a first position; an exit provided in said air-tight chamber through which the devices are carried out of said air-tight chamber toward said device fabrication apparatus, said devices being in a second position different from said first position; means for conveying the devices in said air-tight chamber TO from said entrance to said exit while changing the position of the devices from said first position to said second position; first means for circulating gas which is provided outside said air-tight chamber and which has a fan for circulating the gas in said air-tight chamber and a high-efficiency filter for cleaning the circulating gas so as to supply said air-tight chamber with the clean gas in a laminar flow parallel to the surface of the devices in said first position; and second means for circulating gas which is provided outside said air-tight chamber and which has a fan for circulating the gas in said air-tight chamber and a high-efficiency filter for cleaning the circulating gas so as to Supply said air-tight chamber with the clean gas in a laminar flow parallel to the surface of the devices in said second position.

Since the first environmental control apparatus comprises the first and second means for circulating gas which have the fan for circulation and high-efficiency filter so as to supply the clean gas into the chamber, the amount of the gas to be cleaned is small, for the gas in the chamber is the only gas to be cleaned, resulting in the reduction in cost.

The first means For circulating gas supplies the clean gas in a laminar flow parallel to the surface of the devices in the first position in which they are carried in the air-tight chamber, while the second means for circulating gas supplies the clean gas in a laminar flow parallel to the surface of the devices in the second position in which they are to be carried out toward the device fabrication apparatus, so that the clean gas supplied into the chamber does not stagnate or form a turbulent flow over the main surface of the devices, for a laminar flow parallel to the main surface of the devices always streams over the main surface of the devices even when the position of the devices is changed. This can prevent the phenomenon that extremely fine dust which has passed through the high-efficiency filter adheres to the main surface of the devices, so that the production yield of the devices such as semiconductor and liquid-crystal devices is improved.

In the first environmental control apparatus, said first and second means for circulating gas preferably have a physical or chemical adsorbent for removing a gaseous impurity from the circulating gas.

Thus, the air-tight chamber is supplied with the extremely clean gas which does not contain gaseous impurities, so that the production yield of the devices is further improved.

In the first environmental control apparatus, at least one of said first and second means for circulating gas preferably has an inert-gas supplying means for supplying an inert gas into said air-tight chamber.

Thus, the inert gas is supplied in a laminar flow parallel to the surface of the devices, so that the gas flow in the air-tight chamber is not disturbed by the supply of the inert gas. Hence, the phenomenon that extremely fine dust adheres to the main surface of the devices can be prevented.

In the first environmental control apparatus, said first and second means for circulating gas preferably have a gas conditioning means for regulating the temperature or humidity of the circulating gas.

Thus, the temperature or humidity of the gas supplied into the air-tight chamber can be regulated to the optimum value, so that a film formed on the device can surely have the optimum quality and thickness even when Film quality and thickness are affected by temperature or humidity.

A second environmental control apparatus according to the present invention aims at an environmental control apparatus to be mounted in a device fabrication apparatus which requires a clean environment in producing plate-like devices, comprising: an air-tight chamber; an entrance provided in said air-tight chamber through which devices are carried in said air-tight chamber; an exit provided in said air-tight chamber through which the devices are carried out of said air-tight chamber toward said device fabrication apparatus, said devices staying in the same position since they were carried in through said entrance; means for conveying the devices in said air-tight chamber from said entrance to said exit while keeping the devices in the same position throughout the conveyance since they were carried in through said entrance; and means for circulating gas which is provided outside said air-tight chamber and which has a fan for circulating the gas in said air-tight chamber and a high-efficiency filter for cleaning the circulating gas so as to supply said air-tight chamber with the clean gas in a laminar flow parallel to the surface of the devices.

Since the second environmental control apparatus comprises the means for circulating gas which supplies the air-tight chamber with the clean air in a laminar flow parallel to the surface of the device, the amount of gas to be cleaned is small and the clean gas supplied to the air-tight chamber does not stagnate or form a turbulent flow over the main surface of the device. Hence, the phenomenon that the extremely fine dust that has passed through a high-efficiency filter adheres to the main surface of the device can be prevented.

In the second environmental control apparatus, said means for circulating gas preferably has a physical or chemical adsorbent for removing a gaseous impurity from the circulating gas.

In the second environmental control apparatus, said means for circulating gas preferably has an inert-gas supplying means for supplying an inert gas into said air-tight chamber.

In the second environmental control apparatus, said means for circulating gas preferably has a gas conditioning means for regulating the temperature or humidity of the circulating gas.

BRIEF DESCRIPTION OF THE DRAWINGS

FIG. 1 1 is a cross section taken along the line II—II of FIG. 1, which shows an environmental control apparatus according to a second variation of the first embodiment;

DETAILED DESCRIPTION OF THE PREFERRED EMBODIMENTS

Figure 1:
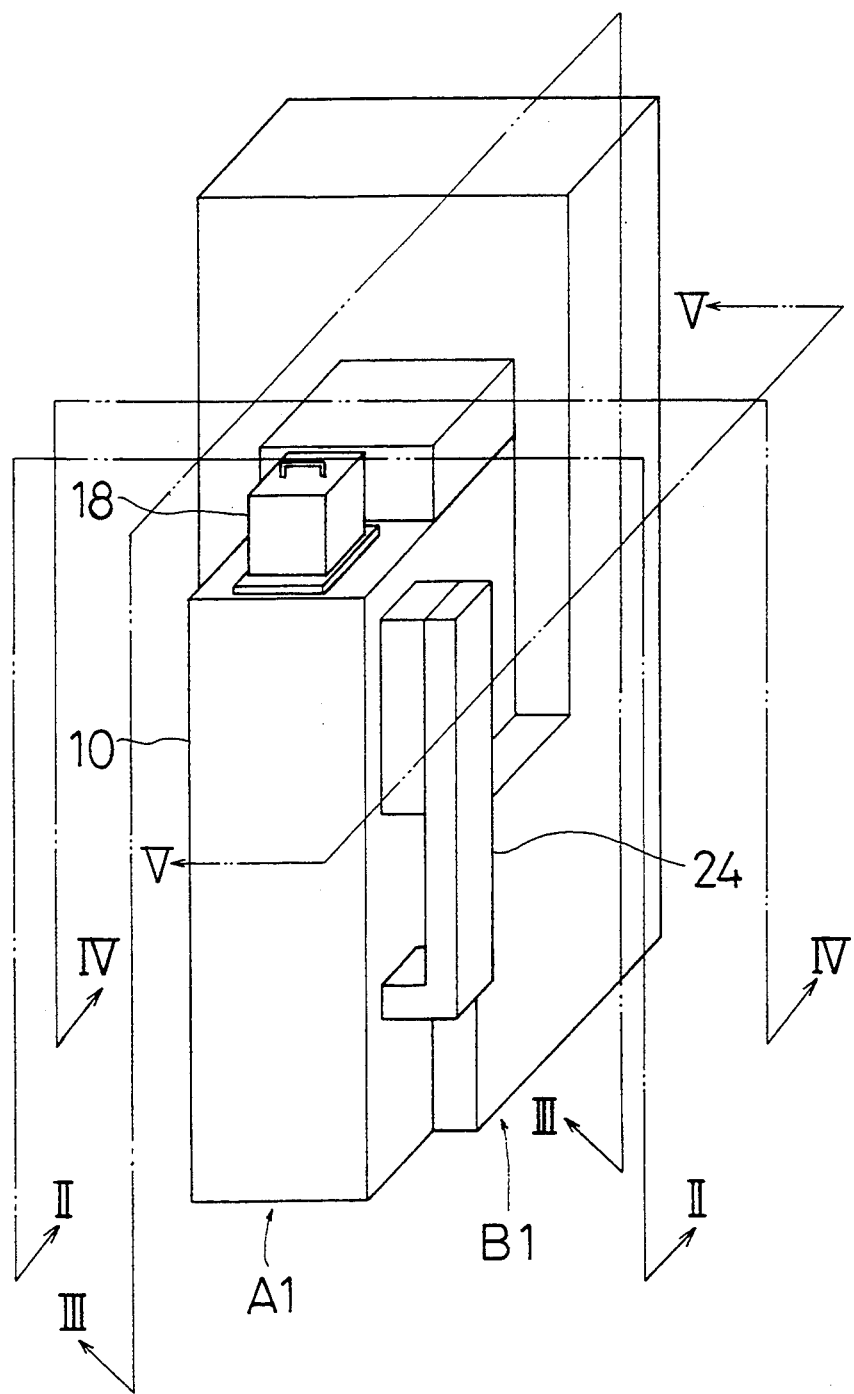
FIG. 1 is a perspective view of an environmental control apparatus according to a first embodiment of the present invention.

Referring now to the drawings, embodiments of the present invention will be described below.

FIGS. 1 to 5 show an environmental control apparatus A1 according to a first embodiment of the present invention.

As shown in FIG. 1, the environmental control apparatus A1 is mounted in a vertical electric furnace serving as a device fabrication apparatus.

The environmental control apparatus A1 comprises an air-tight chamber 10 in the shape of a rectangular parallelepiped. The top wall 10a of the chamber 10 is formed with an entrance 12 through which horizontal semiconductor substrates C in a first position as devices are carried into the chamber 10. The bottom wall 10b of the chamber 10 is formed with an exit 14 through which the vertical semiconductor substrates C in a second position are carried out of the chamber 10 toward the vertical electric furnace B1. The semiconductor substrates C are held in a substrate holder 16 with a U-shaped cross section, and the substrate holder 16 is further held in an airtight container 18 for conveyance, so that the semiconductor substrates C held in the airtight container 18 are placed over the entrance 12 of the chamber 10.

In the chamber 10 is provided an elevator 20 with a carriage 20a. When the carriage 20a descends, the bottom portion of the air-tight container 18 (which is detachable from the main body of the air-tight container 18 and is locked to the main body in time of conveyance) is detached from the main body of the air-tight container 18 to be placed on the carriage 20a which descends in the chamber 10. Along with the bottom portion of the air-tight container 18, the substrate holder 18 disposed thereon and the semiconductor substrates C in the substrate holder 16 also descend. The elevator 20 is provided with an arm 22 for holding substrates. The arm 22 can contract or stretch, can axially rotate, can perform tilt movements, and can ascend and descend. When the holder 18 has descended, the arm 22 holds it, rotates it 90° so that the semiconductor substrates C therein become vertical, and places the holder 16 over the exit 14 of the chamber 10. The elevator 20, carriage 20a, and the substrate holding arm 22 described above constitute a means for conveying the semiconductor substrates C in the chamber 10 from the entrance 12 to the exit 14 while changing its position from the first position to the second position.

Below, the method of conveying the substrate holder 16 in the chamber 10 from the entrance 12 to the exit 14 will be described with reference to FIGS. 6 to 9.

Figure 6:
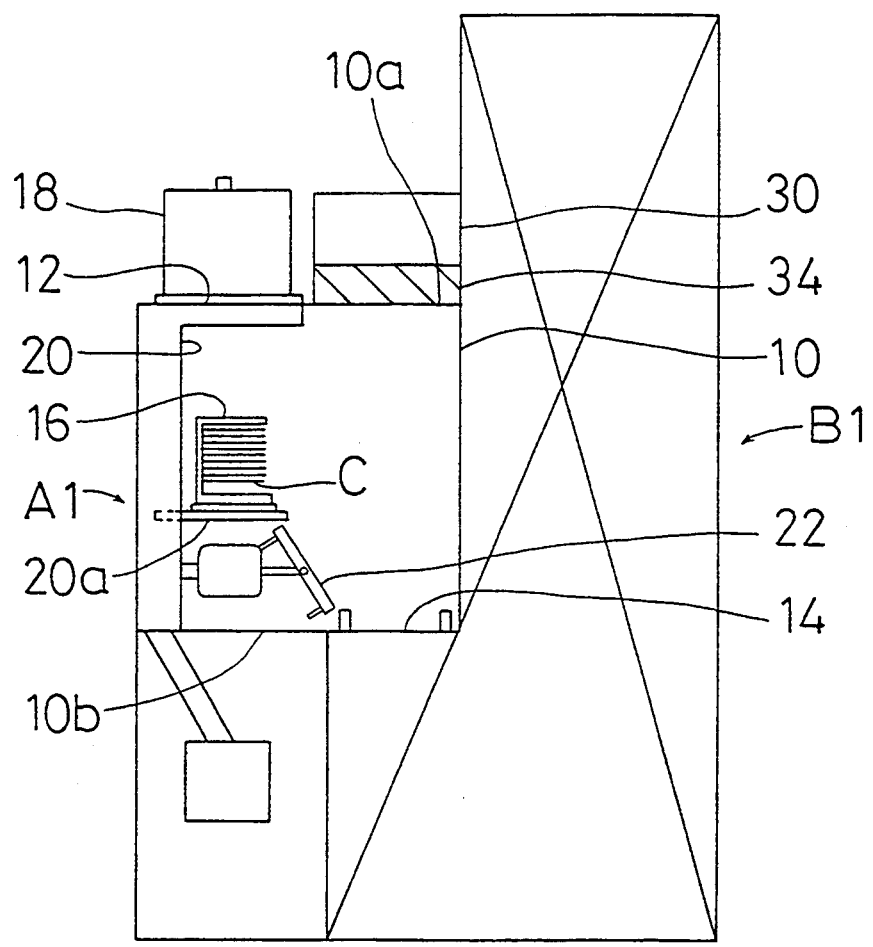
FIG. 6 is a view showing the method of conveying semiconductor substrates in the environmental control apparatus according the first embodiment, which corresponds to FIG. 3.
Figure 7:
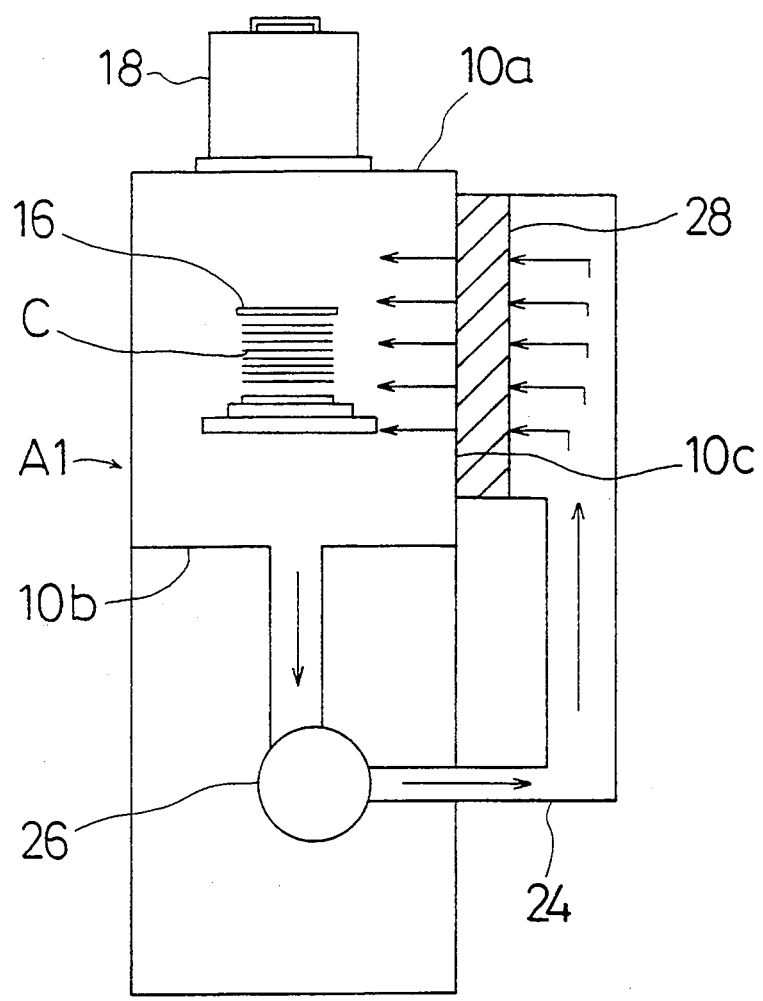
FIG. 7 is a view showing the method of conveying the semiconductor substrates in the environmental control apparatus according the first embodiment, which corresponds to FIG. 2.

First, when the carriage 20a of the elevator 20 is allowed to descend, the bottom portion of the air-tight container 18 for conveyance is detached from the main body thereof to be placed on the carriage 20a which descends in the chamber 10 together with the substrate holder 16, as shown in FIGS. 6 and 7.

Figure 8:
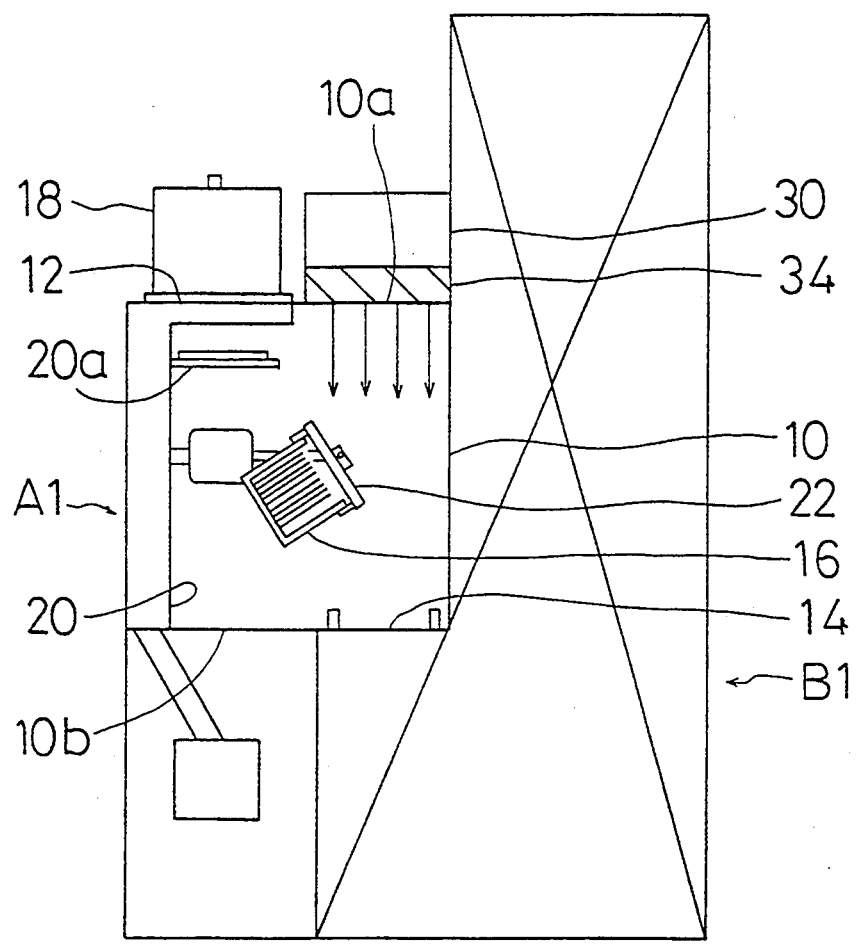
FIG. 8 is a view showing the method of conveying the semiconductor substrates in the environmental control apparatus according the First embodiment, which corresponds to FIG. 3.

Next, as shown in FIG. 8, the arm 22 holds the substrate holder 16 and changes its position so that the semiconductor substrates C, which are held horizontal in the holder 16, become vertical.

Figure 9:
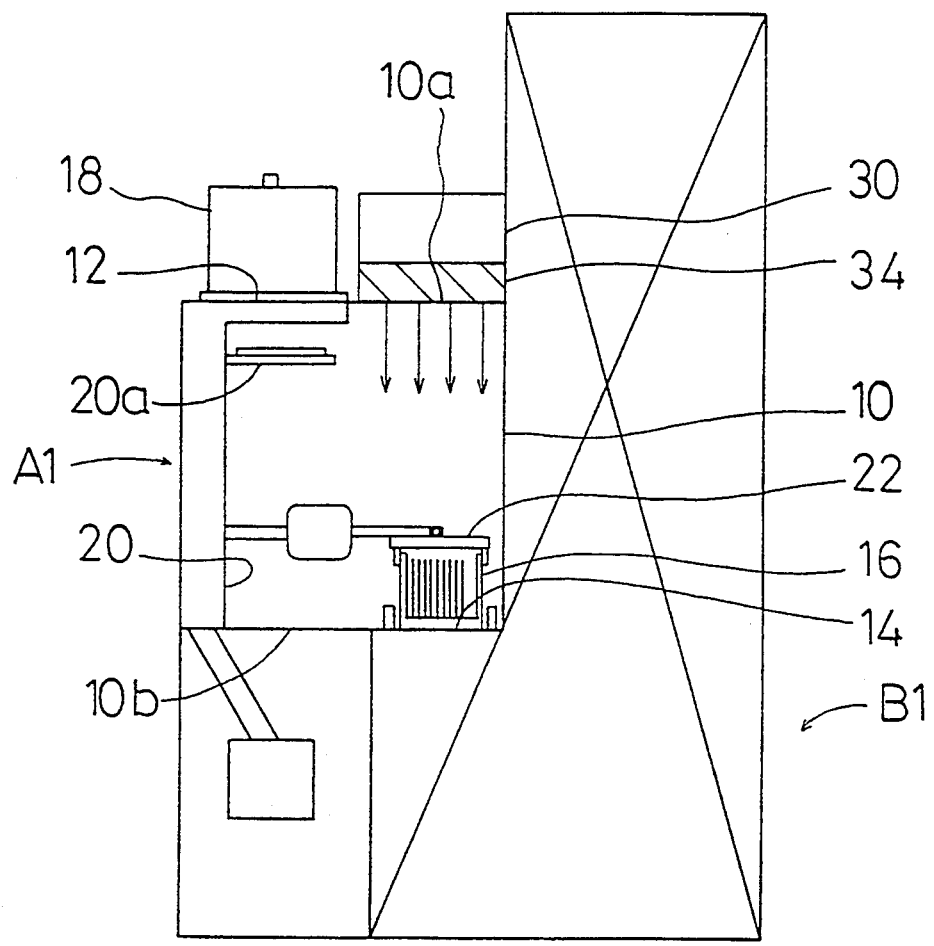
FIG. 9 is a view showing the method of conveying the semiconductor substrates in the environmental control apparatus according the First embodiment, which corresponds to FIG. 3.

Subsequently, as shown in FIG. 9, the arm 22 is stretched downward so as to place the substrate holder 16 over the exit 14 of the chamber 10. The substrate holder 16 placed over the exit 14 is carried into the vertical electric furnace B1 by the conveyance system of the vertical electric furnace B1.

As shown in FIGS. 1 to 5, the chamber 10 is connected to a first duct 24 for circulating gas which is provided outside the chamber 10 and which extends downwardly from the bottom wall 10b of the chamber 10, bends in the right direction of FIG. 1, and then bends again upwardly. The first duct 24 has a fan 28 for circulating the gas in the chamber 10 and a first high-efficiency filter 28 for cleaning the circulating gas. The first high-efficiency filter 28 is attached to the side wall 10c of the chamber 10, so that the gas which has passed through the first high-efficiency filter 28 is supplied into the chamber 10 in a laminar flow parallel to the surface of the semiconductor substrates C in the horizontal position. The first duct 24 for circulating gas, first fan 28 for circulating gas, and first high-efficiency filter 28 described above constitute a first means for circulating gas.

The chamber 10 is also connected to a second duct 30 for circulating gas, which is provided outside the chamber 10 and which extends downwardly from the bottom wall 10b of the chamber 10, bends in the left direction of FIG. 1, then bends again upwardly, and further bends in the right direction of FIG. 1 over the chamber 10. The second duct 30 has a second fan 32 for circulating the gas in the chamber 10 and a second high-efficiency filter 34 for cleaning the circulating gas. The second high-efficiency filter 34 is attached to the top wall 10a of the chamber 10, so that the gas which has passed through the second high-efficiency filter 34 is supplied into the chamber 10 in a laminar flow parallel to the surface of the semiconductor substrates C in the vertical position. The second duct 30 for circulating gas, second fan 32 for circulating gas, and second high-efficiency filter 34 constitute a second means for circulating gas.

Below, the method of cleaning the inside of the chamber 10 will be described with reference to FIGS. 2 to 5. In the drawings, arrows indicate the direction of gas circulation.

First, when the semiconductor substrates C are in the horizontal position, the first fan 28 is activated, so that the gas in the chamber 10 is drawn by the first fan 26 into the first duct 24. The gas in the first duct 24 flows upward and passes through the first high-efficiency filter 28, whereby particulates are removed from the gas, to be supplied into the chamber 10 in a horizontal laminar flow. Since the clean gas streams in a horizontal laminar flow over the main surface of the semiconductor substrates C in the horizontal position, the extremely small particulates mixed in the gas also flow over the semiconductor substrates C and hence do not adhere to the main surface thereof.

Next, when the semiconductor substrates C are in the vertical position, the second fan 32 is activated, so that the gas in the chamber 10 is drawn by the second fan 32 into the second duct 30. The gas in the second duct 30 flows upward, passes through the second high-efficiency filter 34, whereby the particulates are removed from the gas, to be supplied into the chamber 10 in a vertical laminar flow. Since the clean gas streams in a vertical laminar flow over the main surface of the semiconductor substrates C in the vertical position, the extremely small particulates mixed in the gas also flow over the semiconductor substrates C along the main surface thereof and hence do not adhere to the main surface thereof.

The transfer of the semiconductor substrates C to the vertical electric furnace B1 is thus conducted in the highly clean air-tight space, so that the particulates adhering to the main surface can be reduced.

Below, the environmental control apparatus A2 according to a first variation of the first embodiment will be described with reference to FIG. 10.

Figure 2:
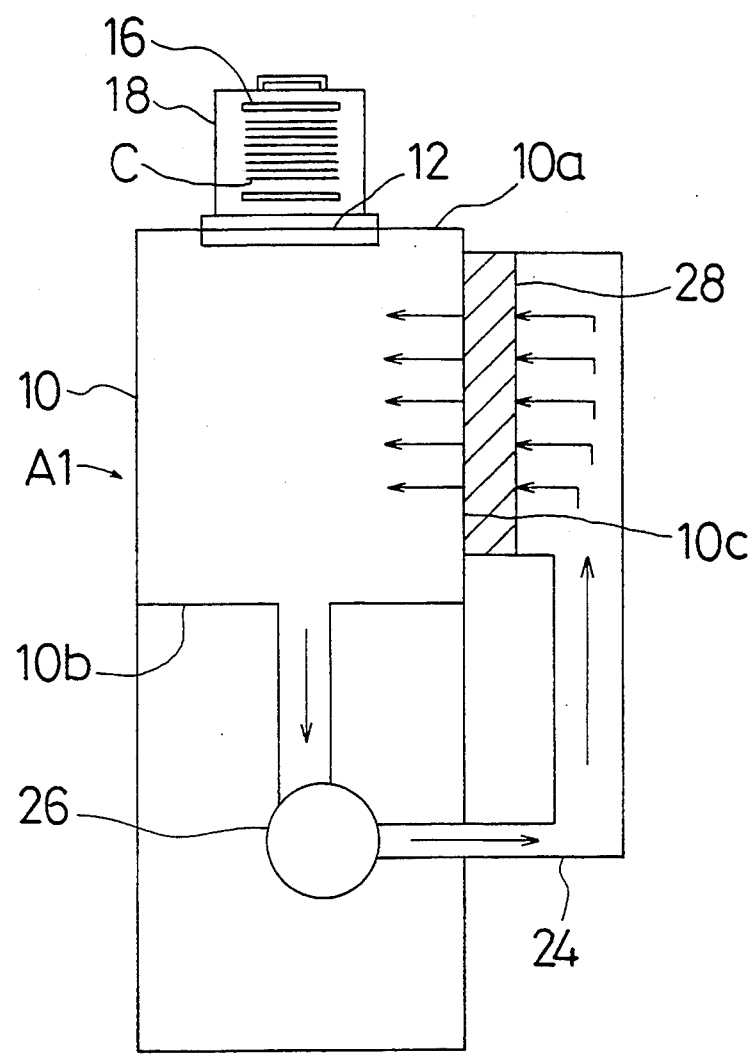
FIG. 2 is a cross section taken along the line II—II of FIG. 1.
Figure 3:
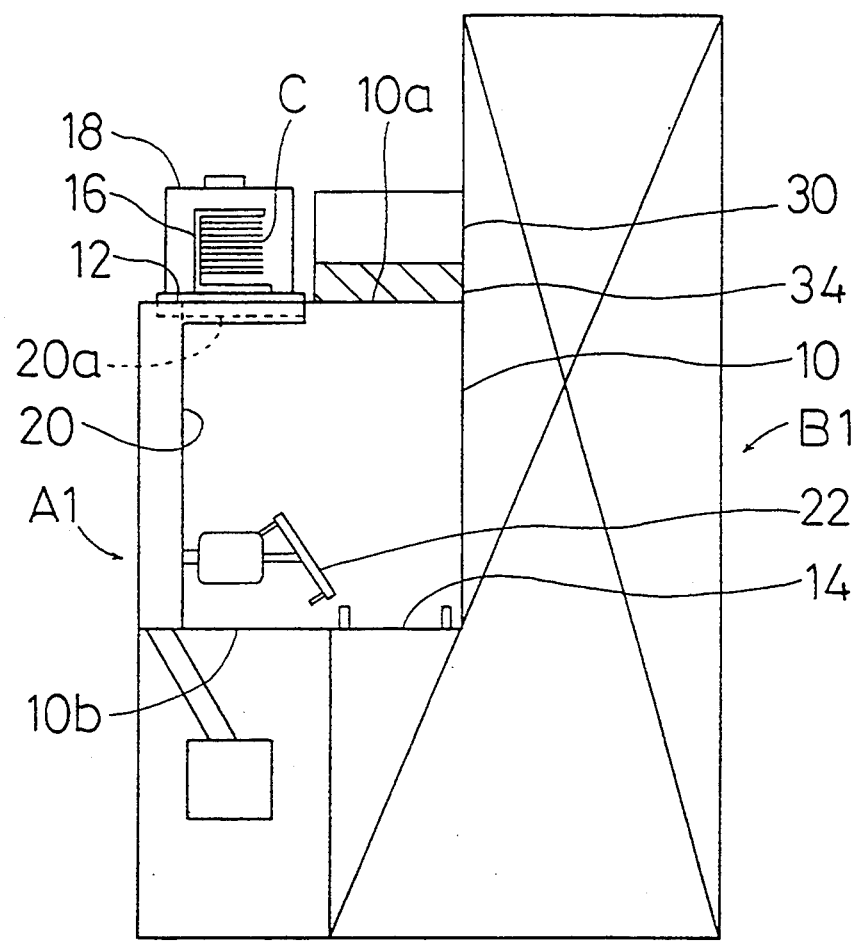
FIG. 3 is a cross section taken along the line III—III of FIG. 1.
Figure 4:
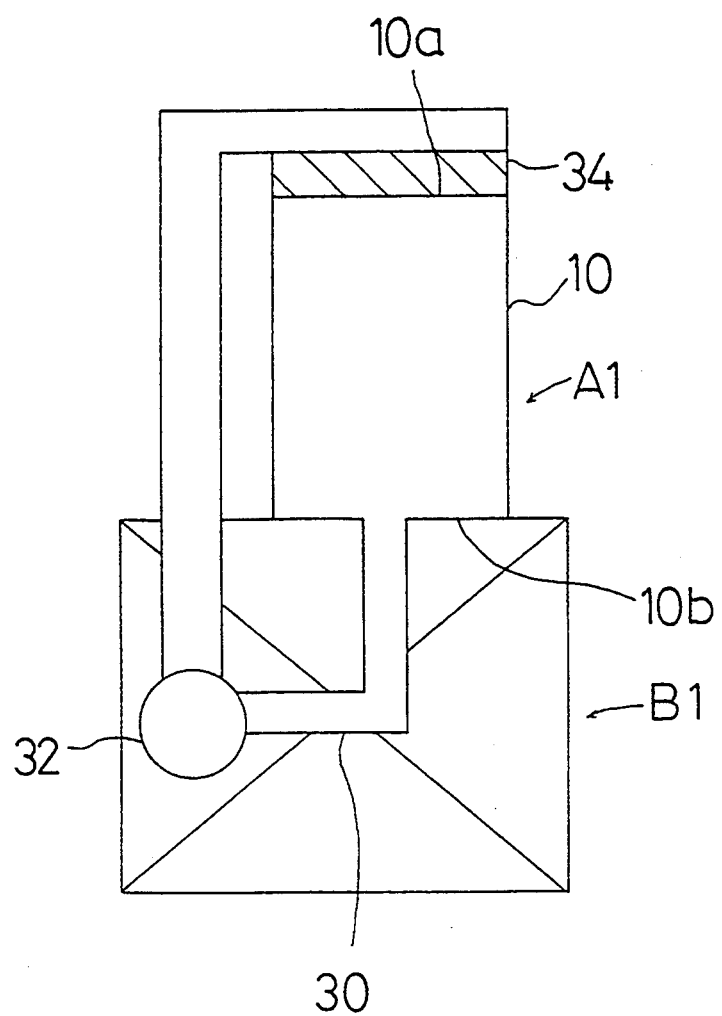
FIG. 4 is a cross section taken along the line IV—IV of FIG. 1.
Figure 5:
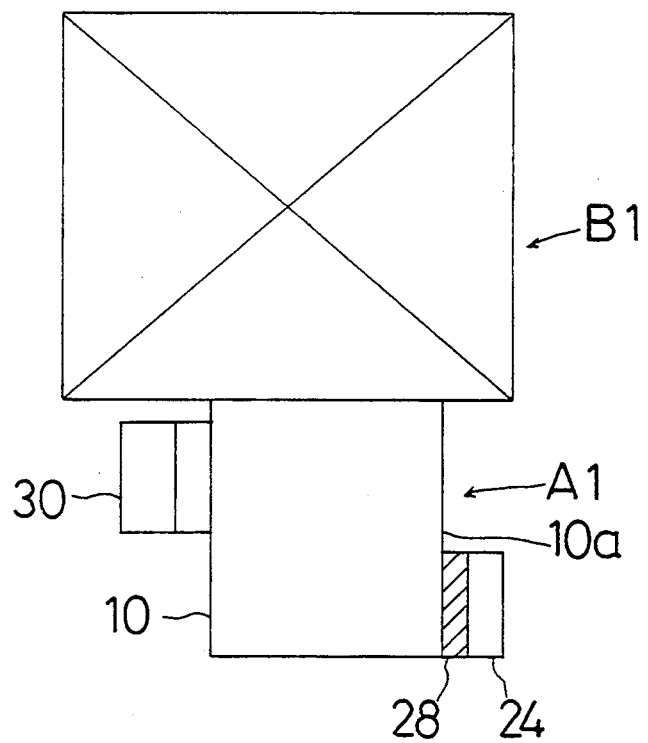
FIG. 5 is a cross section taken along the line V—V of FIG. 1.
Figure 10:
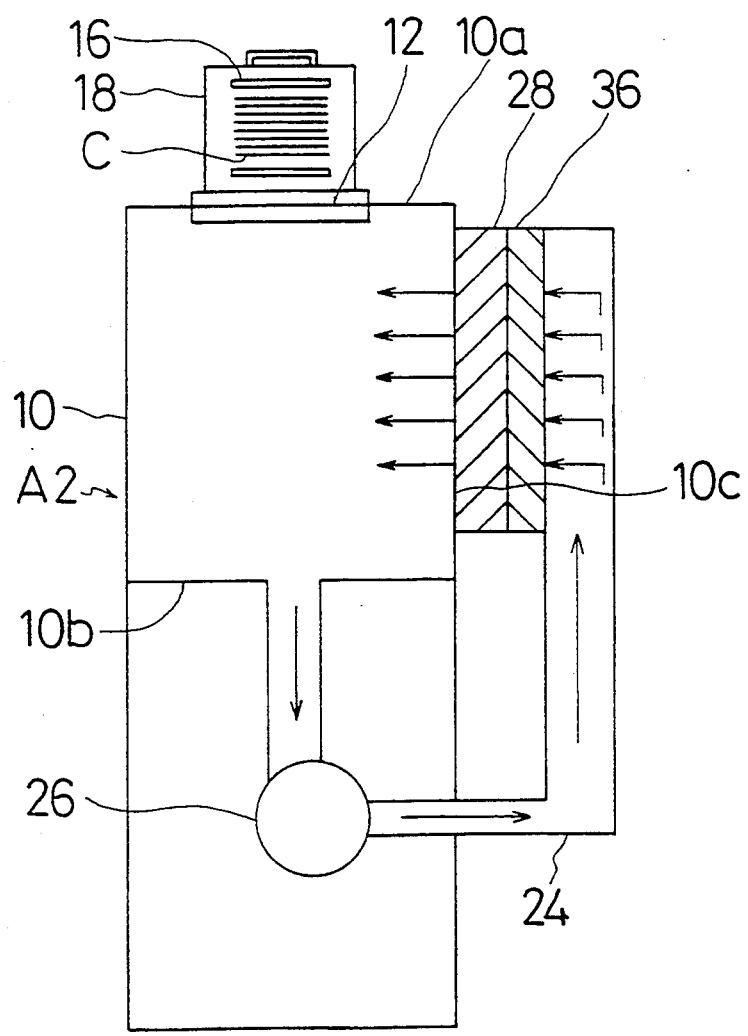
FIG. 10 is a cross section taken along the line II—II of FIG. 1, which shows an environmental control apparatus according to a first variation of the first embodiment.

FIG. 10 is a view showing a cross section taken along the line II—II of FIG. 1, which corresponds to FIG. 2 of the first embodiment. In the first variation, the description of similar elements to those used in the first embodiment will be omitted by providing the same reference numerals as used in the first embodiment.

As shown in FIG. 10, an upstream portion of the first high-efficiency filter 28 is provided with an impurity adsorbent 38 which is composed of a physical or chemical adsorbent for removing gaseous impurities. This removes the gaseous impurities from the gas flowing through the first duct 24, so that the amount of impurities in the gas supplied to the chamber 10 is reduced to several ten p.p.t. or less.

The air in general contains various impurities which may adversely affect semiconductor devices in its fabrication processes. For example, ammonia gas exists in large amount in natural environments as well as it is generated by human bodies. The ammonia gas prevents the reaction of a chemical amplification resist used in the lithographic process of semiconductor fabrication, and changes the dimension of the resulting resist pattern. With the environmental control apparatus A2 according to the first variation, however, the amount of the gaseous impurities is reduced to several ten p.p.t. or less, so that the reaction mentioned above is not prevented and hence the production yield of the resulting semiconductor devices is greatly improved.

Below, the environmental control apparatus AS according to the second variation of the first embodiment will be described with reference to FIG. 11.

Figure 11:
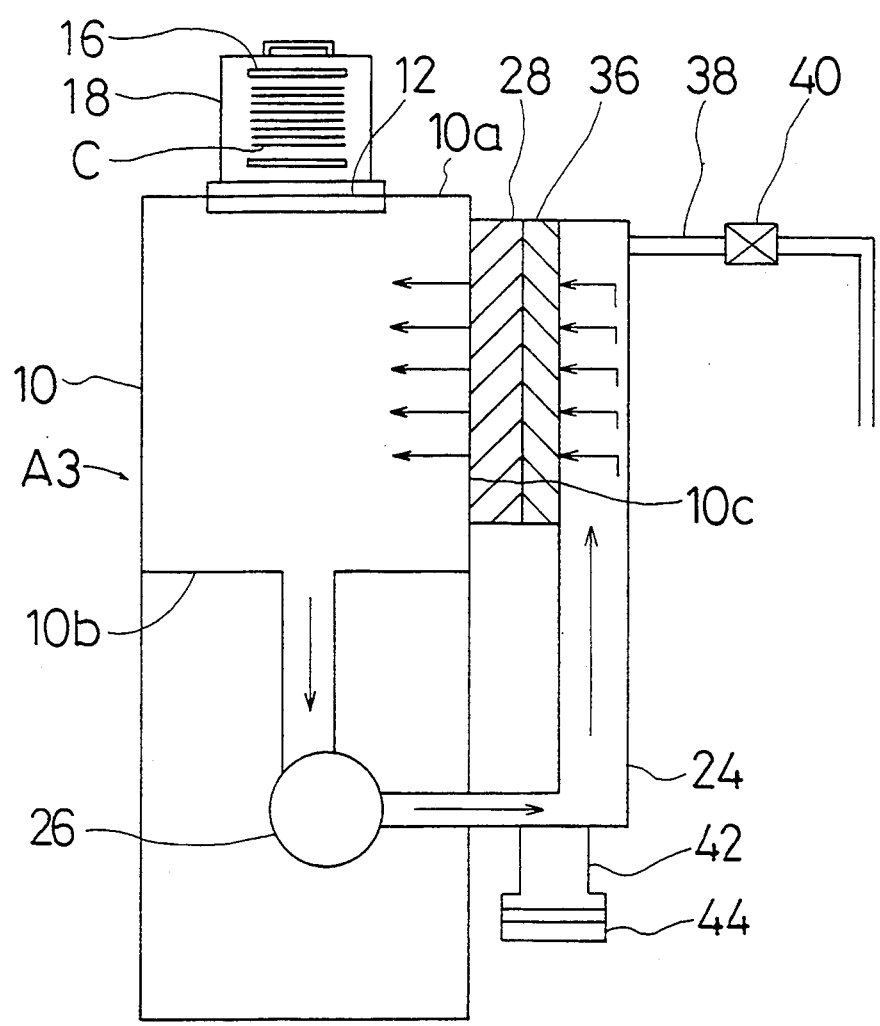

FIG. 11 is a view corresponding to FIG. 2 of the first embodiment, which shows a cross-sectional structure taken along the line II—II of FIG. 1. In the second variation also, the description of similar elements to those used in the first embodiment and its first variation will be omitted by providing the same reference numerals as used in the first embodiment and its first variation.

As shown in FIG. 11, an upstream portion of the first duct 24 for circulating gas is connected to a duct 38 serving as an inert-gas supplying means through which an inept gas is introduced into the chamber 10. The duct 38 for supplying inert gas is provided with a flow-rate regulating valve 40 which regulates the flow rate of the inert gas supplied into the chamber 10. An downstream portion of the first duct 24 is formed with an exhaust hole 42 for exhausting a part of the gas flowing through the first duct 24. The exhaust hole 42 is provided with a dumper 44 which opens the exhaust hole 42 when the pressure in the first duct 24 for circulating gas is higher than the ambient pressure and closes the exhaust hole 42 when the pressure in the first duct 24 for circulating gas is lower than the ambient pressure.

When an inert gas, e.g. nitrogen gas, is introduced into the duct 38 for supplying inert gas, the nitrogen gas is supplied into the chamber 10 through the impurity adsorbent 36 and first high-efficiency filter 28, thereby replacing the gas in the chamber 10 with the inert gas.

The environmental control apparatus A3 according to the second variation is preferably mounted in a sputtering apparatus which is used in the electrode forming process of semiconductor fabrication. In the electrode forming process, a material for the electrode is deposited on the semiconductor substrate, but if the semiconductor substrate is exposed to the ambient air during the deposition of the electrode material, an oxidation film is naturally formed on the semiconductor substrate, which may change the electric contact resistance between the semiconductor substrate and the electrode material. However, if the environmental control apparatus A3 according to the second variation is mounted in the sputtering apparatus used in the electrode forming process, the growth of the natural oxidation film is prevented. Consequently, the characteristics of the resultant semiconductor devices are stabilized and the production yield of the semiconductor substrates is further improved.

Below, an environmental control apparatus A4 according to a third variation of the first embodiment will be described with reference to FIG. 12.

Figure 12:
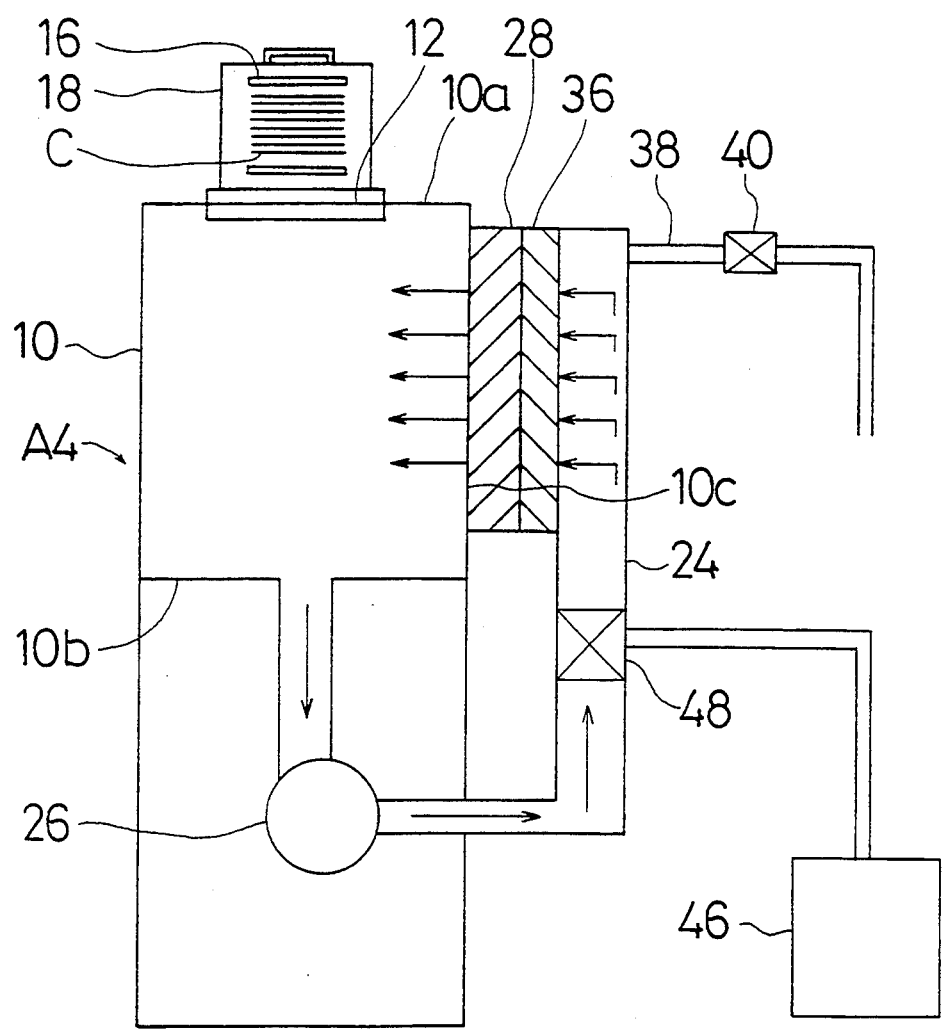
FIG. 12 is a cross section taken along the line II—II of FIG. 1, which shows an environmental control apparatus according to a third variation of the first embodiment.

FIG. 12 is a view corresponding to FIG. 2 of the first embodiment, which shows a cross-sectional structure taken along the line II—II of FIG. 1. In the third variation also, the description of similar elements to those used in the first embodiment and its first and second variations will be omitted by providing the same reference numerals as used in the first embodiment and its first and second variations.

As shown in FIG. 12, the first duct 24 for circulating gas is provided with a heat exchanger 48 which is controlled by a controller 48. The controller 4B and heat exchanger 48 constitute a means for circulating gas whereby temperature and humidity of the gas flowing through the first duct 24 can be conditioned.

The environmental control apparatus A4 according to the third variation is preferably mounted in a resist coater used in the lithographic process of the semiconductor fabrication. Since the film thickness of a resist changes depending on temperature and humidity, stringent temperature and humidity control is required to provide a resist with a uniform film thickness. With the environmental control apparatus A4 according to the third variation, however, it is possible to stabilize the lithographic process.

Below, an environmental control apparatus A5 according to the second embodiment of the present invention will be described with reference to FIGS. 13 and 14.

Figure 13:
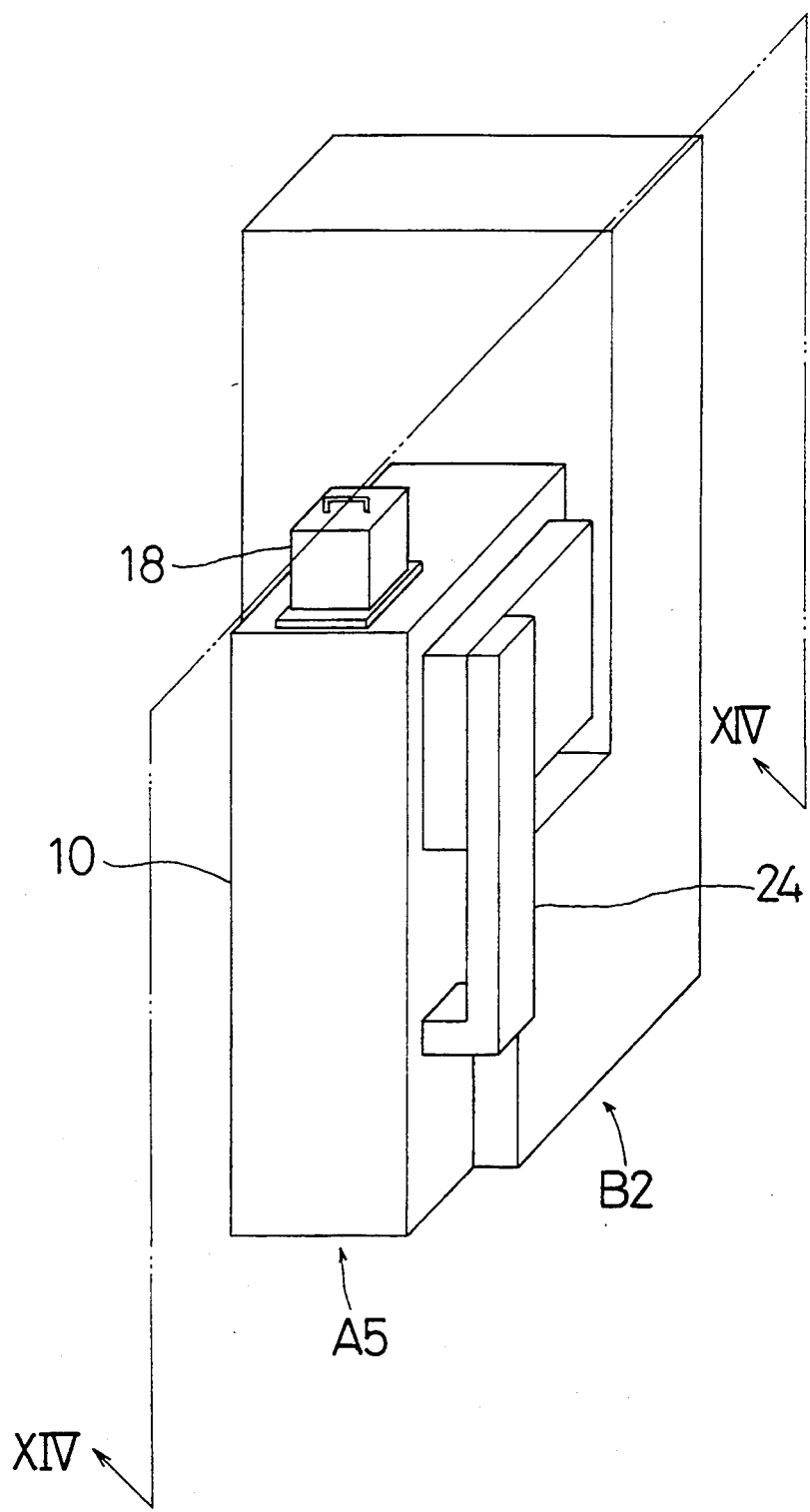
FIG. 13 is a perspective view of an environmental control apparatus according to a second embodiment of the present invention.
Figure 14:
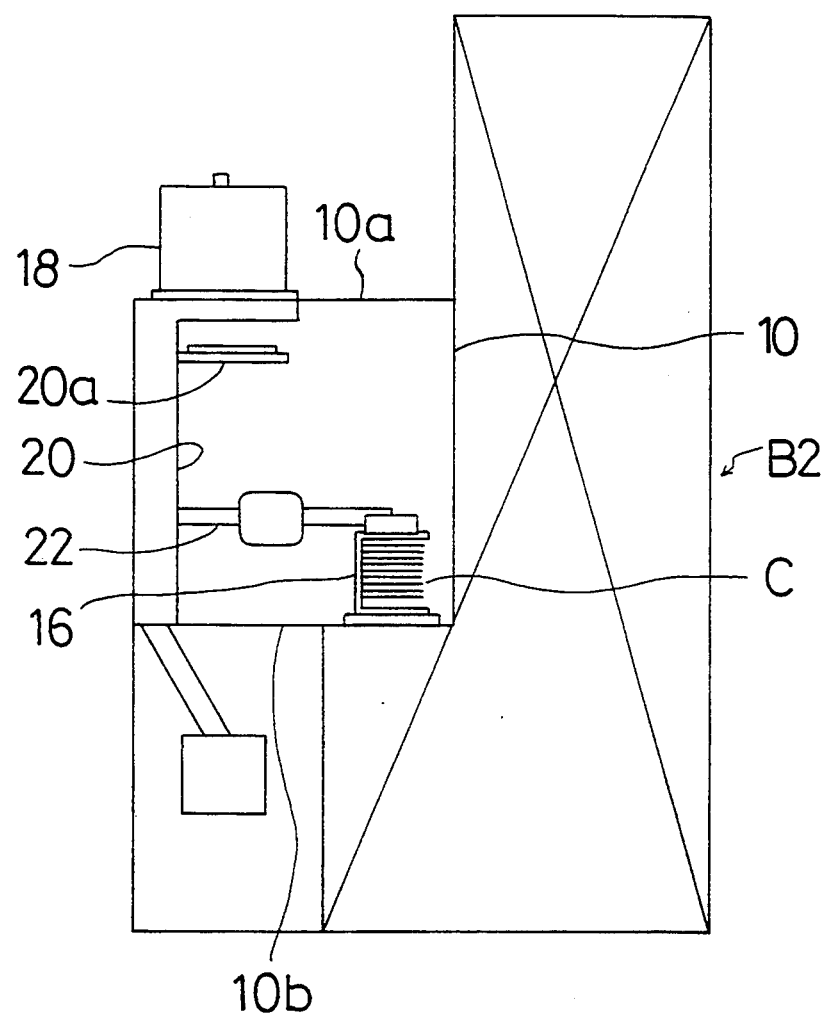
FIG. 14 is a cross section taken along the line XIV—XIV of FIG. 13.
Figure 15:
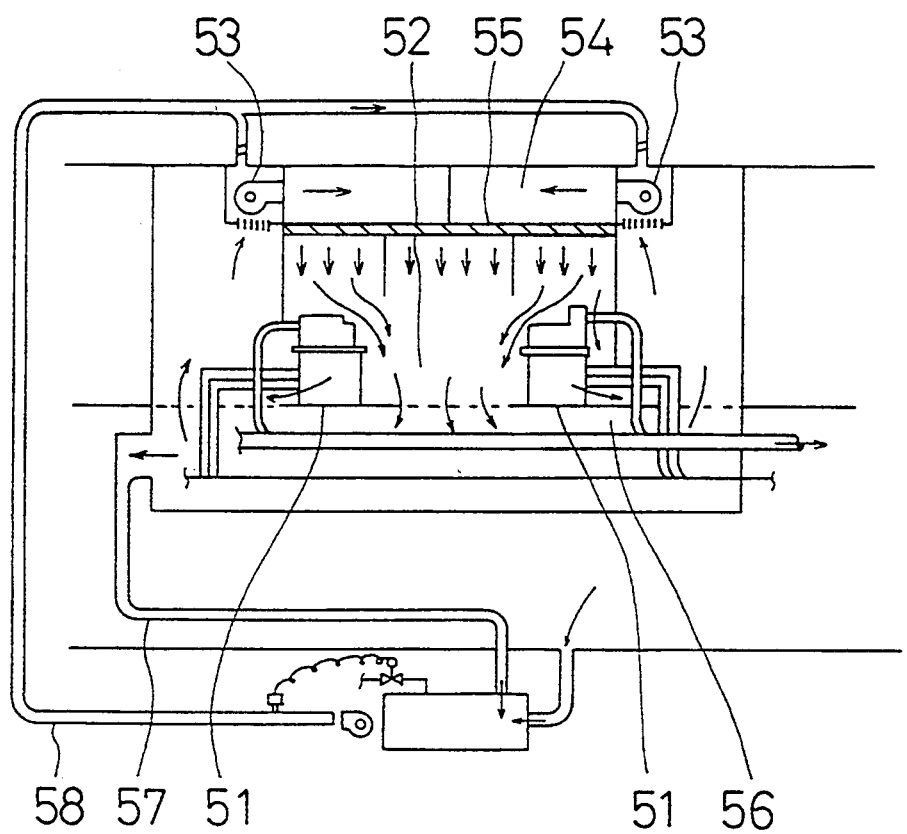
FIG. 15 is a cross section showing a conventional clean room.

FIG. 13 shows the environmental control apparatus A5 according to the second embodiment of the present invention and FIG. 14 shows a cross-sectional structure thereof taken along the line XIV—XIV of FIG. 13. In the second embodiment also, the description of similar elements to those used in the first embodiment will be omitted by providing the same reference numerals as used in the first embodiment.

In the environmental control apparatus A5 according to the second embodiment, the semiconductor substrates C stay in the same position while they are carried in the chamber 10 through the entrance 12 and conveyed therefrom to the exit 14.

The environmental control apparatus A5 is mounted in a dry-etching apparatus B2 serving as the device fabrication apparatus. Typically, the dry-etching apparatus B2 is so designed as to process a single wafer at a time. Accordingly, when the substrate holder 18 is placed over the exit 14, a conveyance arm in the dry-etching apparatus B2 takes semiconductor substrates C one by one in the dry-etching apparatus B2. Therefore, the substrate holder 16 is placed over the exit 14 so that the semiconductor substrates C are in the horizontal position, as shown in FIG. 14.

The environmental control means A5 according to the second embodiment is provided with the first means for circulating gas consisting of the first duct 24, the first fan 28, and the first high-efficiency filter 28, for it is sufficient to supply the chamber 10 with a clean gas in a horizontal laminar flow, similarly to the first embodiment. However, the second means for circulating gas provided in the first embodiment is not provided in the second embodiment.

We claim:

1. An environmental control apparatus to be mounted in a device fabrication apparatus which requires a clean environment in producing plate-like devices, comprising:
    an air-tight chamber;
    an entrance provided in said air-tight chamber through which devices are carried in said air-tight chamber, said devices being in a first position;

an exit provided in said air-tight chamber through which the devices are carried out of said air-tight chamber toward said device fabrication apparatus, said devices being in a second position different from said first position;

means for conveying the devices in said air-tight chamber from said entrance to said exit while changing the position of the devices from said first position to said second position;

first means for circulating gas comprising a first duct which is provided outside of said air-tight chamber, a fan for circulating the gas in said first duct which is provided inside of said first duct, a high-efficiency filter for cleaning the circulating gas and a chemical adsorbent for removing a gaseous impurity from the circulating gas, whereby said first means for circulating gas absorbs from said air-tight chamber the dirty gas flowing through between the devices and supplies said air-tight chamber with a clean gas in a laminar flow parallel to the surface of the devices in said first position; and second means for circulating gas comprising a second duct which is provided outside of said air-tight chamber, a fan for circulating the gas in said second duct which is provided inside of said second duct, a high-efficiency filter for cleaning the circulating gas and a chemical adsorbent for removing a gaseous impurity from the circulating gas, whereby said second means for circulating gas absorbs from said air-tight chamber the dirty gas flowing through between the devices and supplies said air-tight chamber with a clean gas in a laminar flow parallel to the surface of the devices in said second position.

2. An environmental control apparatus according to claim 1, wherein at least one of said first and second means for circulating gas has an inert-gas supplying means for supplying an inert gas into said air-tight chamber.

3. An environmental control apparatus according to claim 1, wherein said first and second means for circulating gas have a gas conditioning means for regulating the temperature or humidity of the circulating gas.

4. An environmental control apparatus to be mounted in a device fabrication apparatus which requires a clean environment in producing plate-like devices, comprising:

an air-tight chamber;

an entrance provided in said air-tight chamber through which devices are carried in said air-tight chamber;

an exit provided in said air-tight chamber through which the devices are carried out of said air-tight chamber toward said device fabrication apparatus, said devices staying in the same position since they were carried in through said entrance;

means for conveying the devices in said air-tight chamber from said entrance to said exit while keeping the devices in the same position throughout the conveyance since they were carried in through said entrance; and means for circulating gas comprising a duct which is provided outside of said air-tight chamber, a fan for circulating the gas in said duct which is provided inside of said duct, a high-efficiency filter for cleaning the circulating gas and a chemical adsorbent for removing a gaseous impurity from the circulating gas, whereby said means for circulating gas absorbs from said air-tight chamber the dirty gas flowing through between the devices and supplies said air-tight chamber with a clean gas in a laminar flow parallel to the surface of the devices.

5. An environmental control apparatus according to claim 4, wherein said means for circulating gas has an inert-gas supplying means for supplying an inert gas into said air-tight chamber.

6. An environmental control apparatus according to claim 4, wherein said means for circulating gas has a gas conditioning means for regulating the temperature or humidity of the circulating gas.

* * * * *